(12) United States Patent
Erickson et al.

(10) Patent No.: US 7,551,470 B2
(45) Date of Patent: Jun. 23, 2009

(54) NON VOLATILE MEMORY RAD-HARD (NVM-RH) SYSTEM

(75) Inventors: Karl R. Erickson, Rochester, MN (US); John A. Fifield, Underhill, VT (US); Chandrasekara Kothandaraman, Hopewell Junction, NY (US); Phil C. Paone, Rochester, MN (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 11/550,918

(22) Filed: Oct. 19, 2006

(65) Prior Publication Data

US 2008/0094896 A1    Apr. 24, 2008

(51) Int. Cl.
*G11C 17/00* (2006.01)
(52) U.S. Cl. ..................... 365/96; 365/225.7
(58) Field of Classification Search ............. 365/225.7, 365/96
See application file for complete search history.

(56) References Cited

U.S. PATENT DOCUMENTS

| | | | |
|---|---|---|---|
| 3,792,319 A | 2/1974 | Tsang | |
| 4,965,828 A | 10/1990 | Ergott, Jr. et al. | |
| 5,412,593 A | 5/1995 | Magel et al. | |
| 5,717,230 A | 2/1998 | Chua et al. | |
| 6,445,606 B1 | 9/2002 | Khoury | |
| 2005/0027409 A1 | 2/2005 | Marshall et al. | |
| 2005/0062062 A1 | 3/2005 | Bertin et al. | |
| 2005/0111290 A1 | 5/2005 | Kozicki et al. | |
| 2006/0136858 A1* | 6/2006 | Erickson et al. ............... | 716/17 |

* cited by examiner

*Primary Examiner*—Hoai V Ho
*Assistant Examiner*—Jason Lappas
(74) *Attorney, Agent, or Firm*—Gibb I.P. Law Firm, LLC; Michael LeStrange, Esq

(57) ABSTRACT

The embodiments of the invention provide an apparatus, method, etc. for a non volatile memory RAD-hard (NVM-rh) system. More specifically, an IC permanent non-volatile storage element comprises an integrated semiconductor stable reference component, wherein the component is resistant to external radiation. The storage element further comprises e-fuse structures in the component and a sensing circuit coupled to the e-fuse structures. The sensing circuit is adapted to update an external device at a specified time interval to reduce incidence of soft errors and errors due to power failure. Moreover, the sensing circuit is adapted to cease updating the external device to program the e-fuse structures; and, continue updating the external device after programming the e-fuse structures.

20 Claims, 4 Drawing Sheets

NON VOLATILE MEMORY RAD-HARD (NVM-RH) SYSTEM

BACKGROUND

1. Field of the Invention

The embodiments of the invention provide an apparatus, method, etc. for a non volatile memory RAD-hard (NVM-rh) system.

2. Description of the Related Art

Memory systems used on chips are susceptible to soft errors. When these chips are created for use in satellites in orbit outside of the Earth's atmosphere, the soft error rate increases greatly due to the increased radiation the chip is exposed to. Additionally, the use of solar power can be interrupted if the satellite drifts into a celestial body's shadow. This power failure can cause the loss of communication information and stored data impairing the operation of the satellite. Systems can be designed with FLASH memory for non volatile data storage, but FLASH technology is not common to standard logic technologies and its addition would make a logic technology expensive.

In addition, it would be advantageous to ensure the radiation state of a system prior to programming.

SUMMARY

The embodiments of the invention provide an apparatus, method, etc. for a NVM-rh system. More specifically, an IC permanent non-volatile storage element comprises an integrated semiconductor stable reference component 110, wherein the integrated semiconductor stable reference component 110 is resistant to external radiation. The storage element further comprises e-fuse structures 125 in the integrated semiconductor stable reference component 110 and a sensing circuit 170 coupled to the e-fuse structures 125. The sensing circuit 170 is adapted to update an external device at a specified time interval to reduce incidence of soft errors and errors due to power failure. Moreover, the sensing circuit 170 is adapted to cease updating the external device to program the e-fuse structures 125; and, continue updating the external device after programming the e-fuse structures 125.

A controller circuit 150 is also provided that is adapted to facilitate programming and sensing of the e-fuse structures 125. The apparatus comprises e-fuse banks 120 of the e-fuse structures 125, wherein the controller circuit 150 is adapted to program a reactivate fuse to reselect a previously deselected e-fuse bank 120. The storage element further comprises an error detection and correction circuit 140 coupled to the sensing circuit 170, wherein the error detection and correction circuit 140 comprises an e-fuse radiation detector 145. The e-fuse radiation detector 145 is within or proximate to an e-fuse bay, wherein the e-fuse radiation detector 145 is adapted to generate a first signal when radiation levels are below a pre-determined amount. The e-fuse radiation detector 145 comprises known unspecific data and is adapted to ascertain a level of radiation that causes a false output report.

Additionally, a security system 160 is provided that is coupled to the controller circuit 150, wherein the security system 160 is configured to control programming access to the e-fuse structures 125. Moreover, the security system 160 comprises e-fuse tamper bits 165 adapted to record unsuccessful code entries into the security system 160, wherein the e-fuse tamper bits 165 are readable. The e-fuse tamper bits 165 are also capable of being interrogated by the security system 160 such that the unsuccessful code entries and possible hacked attempts to access the system may be identified.

Furthermore, a radiation-hardened (RAD-hard) latch 130 is provided that is adapted to store an output of the e-fuse structures 125.

A method is also provided, comprising updating an external device at a specified time interval to reduce incidence of soft errors and errors in a circuit due to power failure.

The updating of the external device can be ceased, wherein the method programs e-fuse structures 125, and subsequently continues updating the external device after the programming of the e-fuse structures 125. The e-fuse structures 125 are grouped into e-fuse banks 120, wherein the method can activate at least one of the e-fuse banks 120, deactivate the at least one of the e-fuse banks 120, and program a reactivate fuse to reactivate the at least one of the e-fuse banks 120.

Furthermore, the method comprises generating a first signal from an e-fuse radiation detector 145 within or proximate to an e-fuse bay when radiation levels are below a pre-determined amount. The method ascertains a level of radiation that causes a false output report by the e-fuse radiation detector 145.

In addition, the method comprises programming and sensing e-fuse structures 125 in the circuit, and controlling programming access to the e-fuse structures 125. Unsuccessful code entries are recorded into the security system 160 within e-fuse tamper bits 165 of the circuit, and the e-fuse tamper bits 165 are read and/or interrogated. Subsequently, an output of the e-fuse structures 125 is stored in a RAD-hard latch 130 in the circuit.

Accordingly, embodiments herein provide e-fuse banks 120 that can be used as a means of permanent, non disruptive, non volatile storage. As more fully described below, the system is not disrupted by error events induced by external radiation or power failure because the sensing controls are put into a continual loop. The e-fuse structures 125 can be programmed (blown) prior to, during, or after a satellite is launched into space. Once the e-fuse structures 125 are blown, any errors induced by radiation into the RAD-hard latches 130 containing the e-fuse data will be refreshed before the data has more errors in it than a standard ECC function can correct. By setting the sensing loop based on time instead of error count, the susceptibility to multi-error events reduces drastically.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
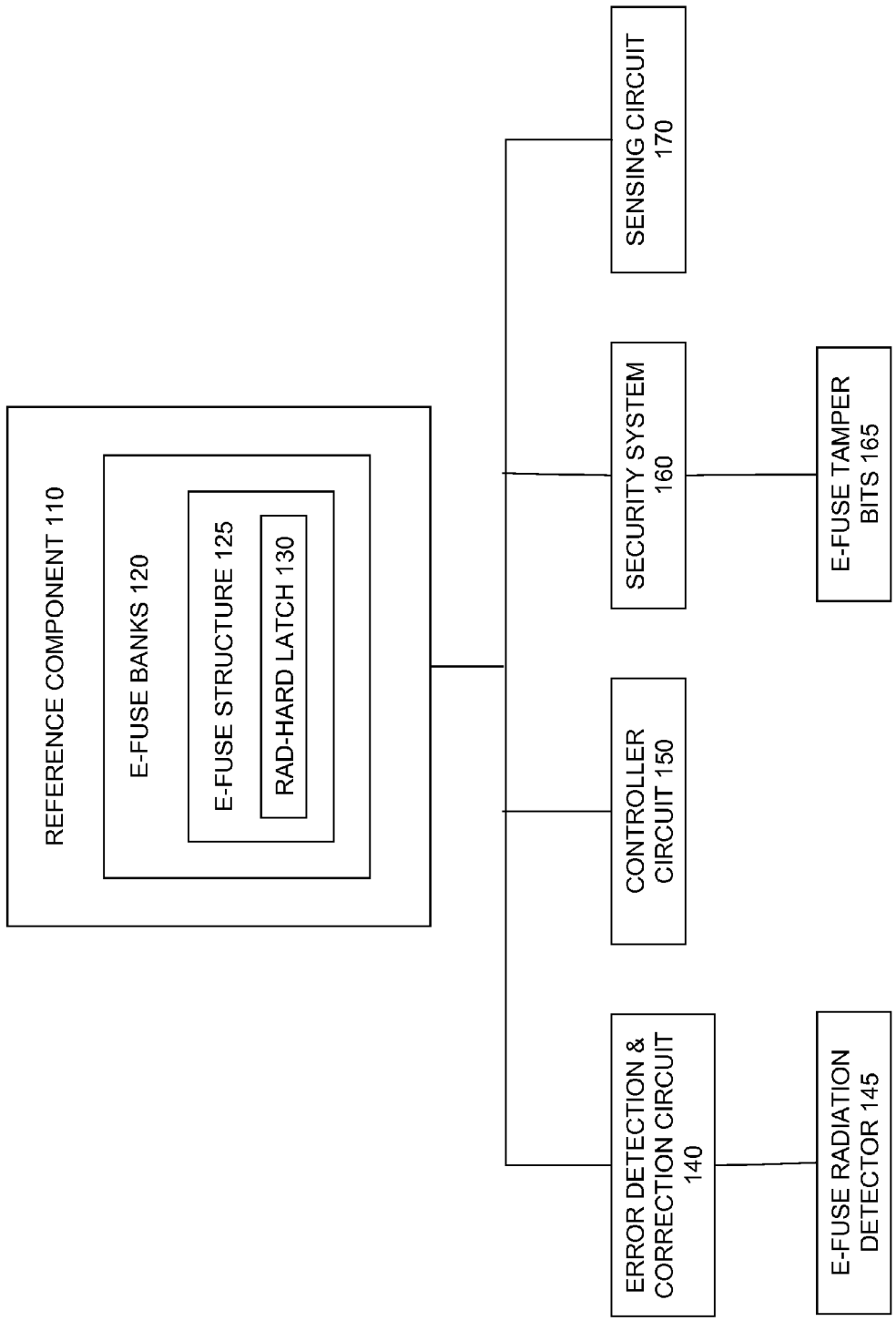
FIG. 1 is a diagram illustrating a NVM-rh system.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As illustrated in FIG. 1, embodiments herein provide an NVM-rh system which includes e-fuse banks 120, which further include on-chip e-fuse structures 125 that can be used as a means of permanent, non disruptive non volatile storage. The e-fuse structures 125 can be programmed (blown) prior to, during, or after a satellite is launched into space. Once the e-fuse structures 125 are blown, any errors induced by radiation into the RAD-hard latch 130 containing the e-fuse data will be refreshed before the data has more errors in it than the error detection and correction circuit 140 can correct. E-fuse structures 125 further include a RAD-hard latch 130, which holds the e-fuse data. Once e-fuse structures 125 are blown, any errors induced by radiation will be corrected by an ECC function performed by an error detection and correction circuit 140. Error detection and correction circuit 140 identifies the number of errors induced by radiation in the RAD-hard latch 130 and performs the ECC function before the errors number more than the ECC can correct. By setting the sensing loop based on time instead of error count, the susceptibility to multi-error events reduces drastically.

Due to the fact that the data stored in the e-fuse structures 125 is security dependent, a tag is first sent to the controller circuit 150 before it will allow new e-fuse structures 125 to be blown. This process is describing an instruction programming code (IPCODE), which may or may not be scrambled. The IPCODE could be a security code or a specific address as in Internet protocol address. This code unlocks the programming node, or capability of the e-fuse structure 125. If an unsuccessful code is entered, a permanent e-fuse tamper bit 165 is programmed in the security system 160 following an unsuccessful IPCODE entry. The e-fuse tamper bits 165 are readable and may be interrogated such that failed or hacked attempts are recorded.

Assuming that an IPCODE is entered correctly, once the e-fuse structures 125 are blown, the sensing circuit 170 can be put into a continual loop. This loop will only be stopped if additional e-fuse structures 125 need to be blown again by sending the proper security tag (or IPCODE) to the controlling logic first. Once the new data has been programmed, the e-fuse sensing controls go back into the continuous loop. By including a time based loop in the sensing circuitry the e-fuse structure 125 values become immune to any errors induced by external radiation or power failure. This system can be used to store critical information securely. Exploratory satellites can store coordinates for home base as well as destination coordinates. These coordinates can be changed if required while the satellite is in orbit. Communications satellites can also store encryption keys. These keys could also be changed after the satellite is in space if the key is cracked. Using e-fuse structures 125 as a storage means in aerospace applications increases the life and usefulness of satellite systems. Moreover, e-fuse structures 125 are also impervious to radiation upsets, unlike an non volatile random access memory (NVRAM) which is susceptible. Therefore an e-fuse structure 125 based information storage system is superior to an NVRAM based system. As a brief example, voting logic (best 2 out of 3, or 4 out of 6, etc.) where multiple arrays of non volatile memory (NVM) may be programmed and read are not required. A new methodology would utilize the time domain, and simply read the e-fuse structure 125 encoding multiple times, as it's information will not change, but the downstream logic (also applicable for NVM) may be affected by a radiation upset. This implementation saves on both power and complexity for storage.

This concept could also be applied to military applications such as missile systems, where missile control and target information could be updated after the missile is launched while still maintaining the required communication security. In this case, the programming bits could be verified by incorporating a volatile shadow latch, and adding the results with the permanent e-fuse program to insure correct programming. In addition, since e-fuse bits are relatively small in size (they can be fabricated at technology minimum image), two or more e-fuse bits can be programmed for each bit of information, and an OR'ed result can take the place of a shadow latch. Prior to programming, the radiation state of the system is determined. Prior to programming an e-fuse structure 125 in a harsh, radiation environment, it is useful to determine the environments state, and to couple programming of e-fuse structures 125 if the environment is deemed acceptable. One way of generating a radiation free or "ok to program" pulse (also referred to herein as the "first signal") is to have a predisposed e-fuse radiation detector 145 surrounding the actual e-fuse bay. The e-fuse radiation detector 145 would have known unspecific data (a known good digital DNA preprogrammed), wherein the data is not specified as a "1" or a "0" at the time of design, and wherein the data does not change once the e-fuse structures 125 are blown. The e-fuse radiation detector 145 further includes a set of fuse sense and latch circuitry that is either identical in design to the circuitry that will be used to sense and latch the e-fuse structure 125, or it could be designed such that the critical charge to upset such circuitry is more sensitive to a radiation disturbance, simply by decreasing it's node capacitance. In this case, all known good e-fuse bits are added to provide an "ok to program" signal. This can be coupled to each e-fuse program if desired, or the first and last e-fuse program bit.

This design can be staggered so that latches of differing Qcrit (Q=CV), in this case "C", would be varied through design, both by junction area (RX) and in combination with gate oxide variations (i.e., thin or thick oxide). Qcrit is the critical amount of charge threshold above which the state of the latch flips. This indicates that a radiation event has occurred; i.e., additional absorption of radiation event has increased Q (charge). The latches will be alternatively locked in a given state, and used as a Qcrit detector; i.e., if a latch resets then it is a signal that radiation on the order of Qcrit(n) where n signifies the highest Qcrit design that tripped. This Qcrit can then be fed into a system eval unit where either the unit responds with an "ok to program" e-fuse structures 125, or not. The system eval unit may in fact temporarily alter the power supply (i.e., raise V) such that Qcrit susceptibility is minimized, then reset the tripped latches, and re-evaluate the environmental (i.e., radiation) state and once again make a decision of safety to program an e-fuse structure 125 or not.

This provides an additional method for using existing circuitry in a design to self regulate itself relative to its current radiation environment.

Figure 2:
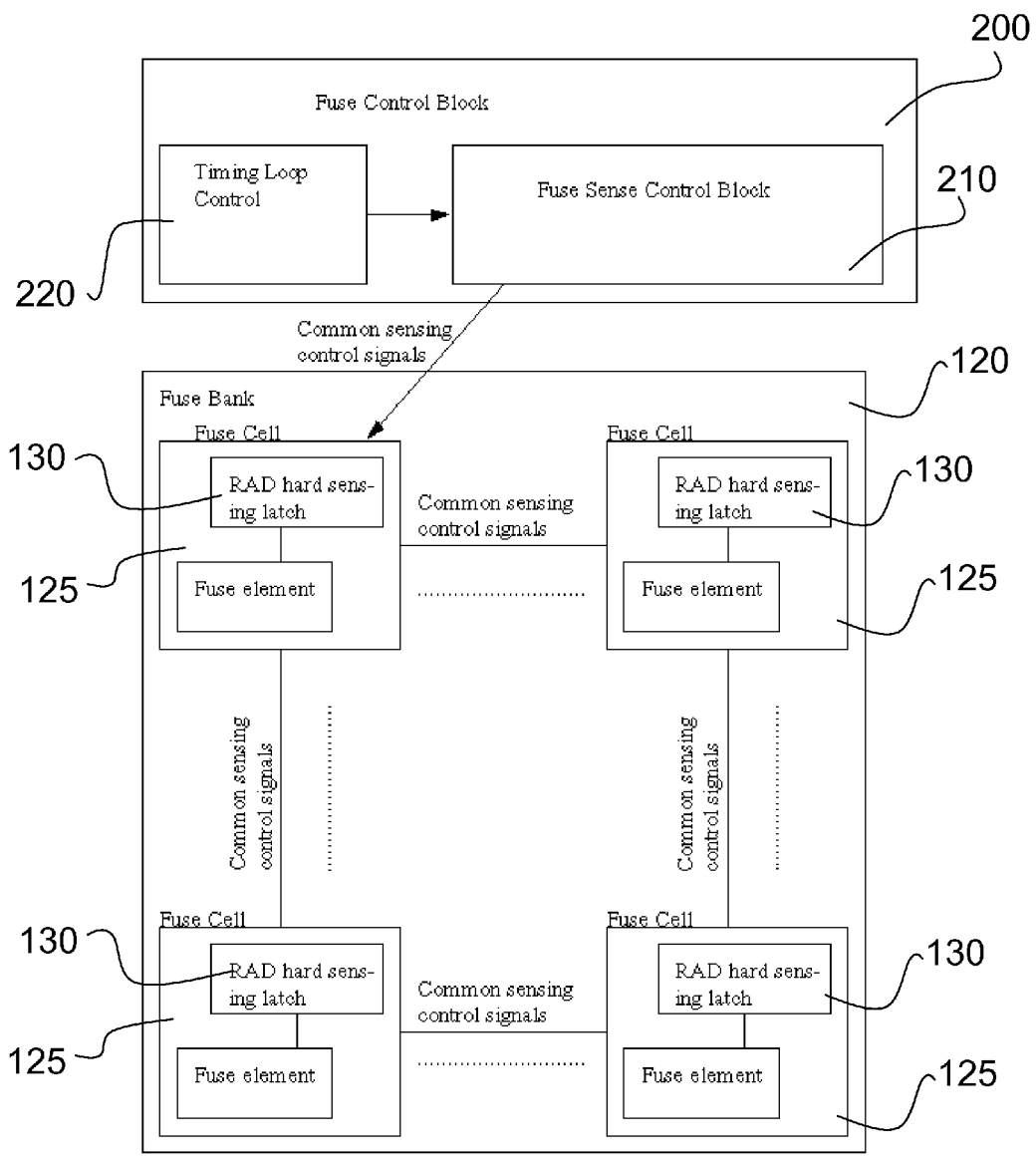
FIG. 2 is a diagram illustrating a NVM-rh system showing a fuse control block 200.

In general, the e-fuse structures 125 are put into a large e-fuse bank 120 where the sensing signals are made common throughout the entire e-fuse bank 120. As illustrated in FIG. 2, the e-fuse bank 120 is then hooked to a fuse control block 200 that contains counters to issue fuse blow and fuse sense commands to the e-fuse bank 120. The controller circuit 150 contains programmable counters to control the timing of all the signals sent to the e-fuse bank 120. The fuse sense control block 210 will also have a loop option (via a timing loop control 220) causing the e-fuse structures 125 to be resensed on a given time interval.

The input to the fuse control block 200 is a valid IPCODE that will enable fuse programming. An output block is a counter with a small amount of e-fuse structures 125 that are only programmed (sequentially) when an invalid IPCODE is entered. Both a valid IPCODE and "ok to program" signal would be required to initiate an e-fuse program.

Further, e-fuse structure 125 program validation may be accomplished through the use of a shadow latch added with the fuse bits during programming. Redundant single bits may be steered into the programming validation given an unsuccessful first attempt.

The e-fuse structures 125 may also be fabricated of "n" bits in parallel to form one valid OR'ed bit after programming. Such an implementation would then circumvent the shadow latch described above.

Once the e-fuse structures 125 are blown, any errors induced by radiation into the latches containing the e-fuse data will be refreshed before the data has more errors in it than a standard ECC function can correct. By setting the sensing loop based on time (as described further below) instead of error count, the susceptibility to multi-error events reduces drastically.

Storage of the e-fuse values after sensing can be done in a RAD-hard latch 130, such as a design using resistor coupling between inversion stages, or containing ballast capacitance to increase the storage Q-crit. The sense latch can also be designed to be RAD-hard using these same techniques. Sensing can accomplish spatially (i.e., repeated sense loops) such that stable, non changing results are verified. Valid sense loops can also be made to read conditionally on the "ok to program" signal described above. This is especially useful during a power-up sequence during an initial e-fuse read.

To update the programming, e-fuse bank 120 enable e-fuse structures 125 can be blown to select a new e-fuse bank 120 and to disable the previous e-fuse bank 120. In this system, data can continue to be updated until all e-fuse banks 120 have been used. Logic can be designed where previously disabled e-fuse banks 120 can be reactivated by programming a reactivate fuse. This allows a previously disabled e-fuse bank 120 to be reselected.

Figure 3:
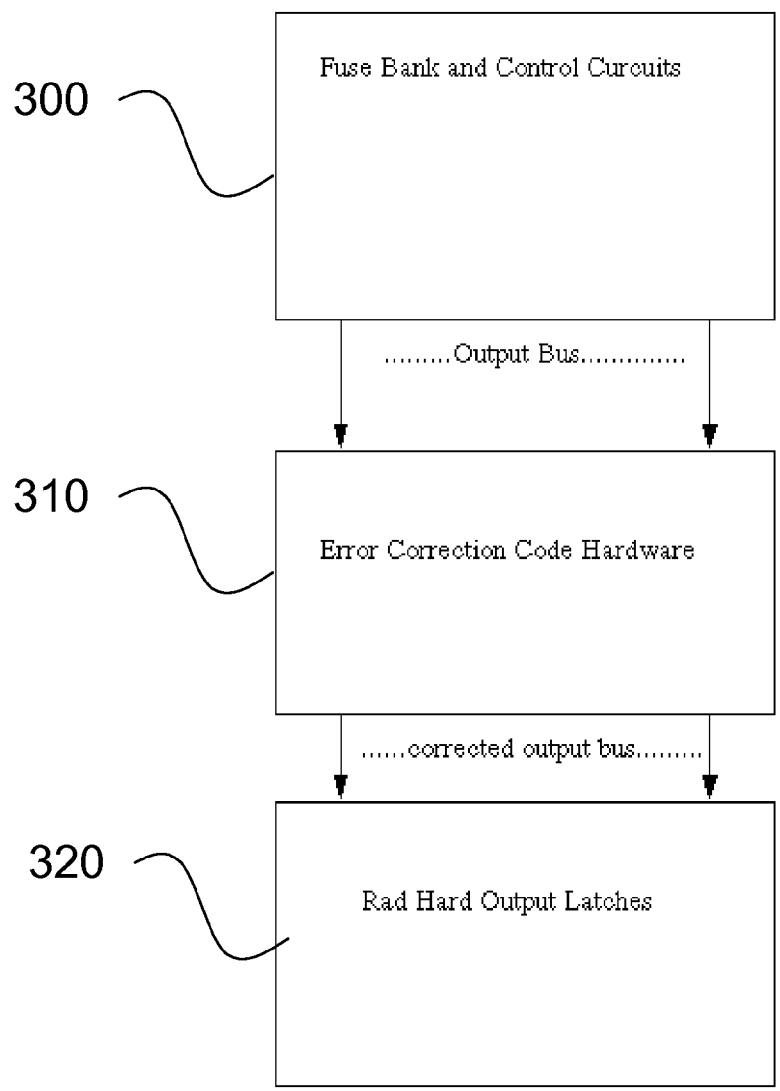
FIG. 3 is a diagram illustrating a NVM-rh system showing an output bus.

As illustrated in FIG. 3, the output bus of the fuse array is corrected before being latched into RAD-hard latches 130 to be used by logic downstream. By using a combination of e-fuse bank 120 and control circuits 300, error correction code hardware 310, and RAD-hard storage/output latches 320, a NVM-rh system is created that is impervious to radiation events and can automatically recover its information after a power outage.

Thus, the embodiments of the invention provide an apparatus, method, etc. for a NVM-rh system. More specifically, an IC permanent non-volatile storage element comprises an integrated semiconductor stable reference component 110, wherein the integrated semiconductor stable reference component 110 is resistant to external radiation. The storage element further comprises e-fuse structures 125 in the integrated semiconductor stable reference component 110 and a sensing circuit 170 coupled to the e-fuse structures 125. As described above, two or more e-fuse bits can be programmed for each bit of information, and an OR'ed result can take the place of a shadow latch. The sensing circuit 170 is adapted to update an external device at a specified time interval to reduce incidence of soft errors and errors due to power failure. As described above, by setting a sensing loop based on time instead of error count, the susceptibility to multi-error events reduces drastically.

Moreover, the sensing circuit 170 is adapted to cease updating the external device to program the e-fuse structures 125; and, continue updating the external device after programming the e-fuse structures 125. As described above, the loop will only be stopped if additional e-fuse structures 125 need to be blown again by sending the proper security tag (or IPCODE) to the controlling logic first. Once the new data has been programmed, the e-fuse sensing controls go back into the continuous loop.

A controller circuit 150 is also provided that is adapted to facilitate programming and sensing of the e-fuse structures 125. As described above, the fuse control block 200 contains counters to issue fuse blow and fuse sense commands to the e-fuse structures 125. The controller circuit 150 contains programmable counters to control the timing of all the signals sent to the e-fuse structures 125. Moreover, the apparatus comprises e-fuse banks 120 of the e-fuse structures 125, wherein the controller circuit 150 is adapted to program a reactivate fuse to reselect a previously deselected e-fuse bank 120. As described above, to update the programming, e-fuse bank 120 enable e-fuse structures 125 can be blown to select a new e-fuse bank 120 and to disable the previous e-fuse bank 120. In this system, data can continue to be updated until all e-fuse banks 120 have been used.

The storage element further comprises an error detection and correction circuit 140 coupled to the sensing circuit 170, wherein the error detection and correction circuit 140 comprises an e-fuse radiation detector 145. The e-fuse radiation detector 145 is within or proximate to an e-fuse bay, wherein the e-fuse radiation detector 145 is adapted to generate a first signal when radiation levels are below a pre-determined amount. The e-fuse radiation detector 145 comprises known unspecific data and is adapted to ascertain a level of radiation that causes a false output report. As described above, the e-fuse radiation detector 145 would have a set of fuse sense and latch circuitry that is either identical in design to the circuitry that will be used to sense and latch the e-fuse structure 125, or it could be designed such that the critical charge to upset such circuitry is more sensitive to a radiation disturbance, simply by decreasing it's node capacitance. In this case all known good e-fuse bits are added to provide an "ok to program" signal. This can be coupled to each e-fuse program if desired, or the first and last e-fuse program bit.

Additionally, a security system 160 is provided that is coupled to the controller circuit 150, wherein the security system 160 is configured to control programming access to the e-fuse structures 125. As described above, due to the fact that the data stored in the e-fuse structures 125 is security dependent, a tag is first sent to the controller circuit 150 before it will allow new e-fuse structures 125 to be blown. This process is describing an IPCODE, which may or may not be scrambled. The IPCODE could be a security code or a specific address as in Internet protocol address. This code unlocks the programming node, or capability of the e-fuse structure 125. Moreover, the security system 160 comprises e-fuse tamper bits 165 adapted to record unsuccessful code entries into the security system 160, wherein the e-fuse tamper bits 165 are readable and are capable of being interrogated. Furthermore, a RAD-hard latch 130 is provided that is adapted to store an output of the e-fuse structures 125. As described above, the RAD-hard latch 130 could comprise a design using resistor coupling between inversion stages, or containing ballast capacitance to increase the storage Q-crit. The sense latch can also be designed to be RAD-hard using these same techniques.

A method is also provided, comprising updating an external device at a specified time interval to reduce incidence of soft errors and errors in a circuit due to power failure. As described above, once e-fuse structures 125 are blown, any errors induced by radiation into the latches containing the e-fuse data will be refreshed before the data has more errors in it than a standard ECC function can correct. By setting the sensing loop based on time instead of error count, the susceptibility to multi-error events reduces drastically.

The updating of the external device can be ceased, wherein the method programs e-fuse structures 125, and subsequently continues updating the external device after the programming of the e-fuse structures 125. As described above, the loop will only be stopped if additional e-fuse structures 125 need to be blown again by sending the proper security tag (or IPCODE) to the controlling logic first. Once the new data has been programmed, the e-fuse sensing controls go back into the continuous loop. The e-fuse structures 125 are grouped into e-fuse banks 120, wherein the method can activate at least one of the e-fuse banks 120, deactivate the at least one of the e-fuse banks 120, and program a reactivate fuse to reactivate the at least one of the e-fuse banks 120. As described above, to update the programming, e-fuse bank 120 enable e-fuse structures 125 can be blown to select a new e-fuse bank 120 and to disable the previous e-fuse bank 120. In this system, data can continue to be updated until all e-fuse banks 120 have been used.

As also described above, the radiation state of the system is determined prior to programming. Prior to programming an e-fuse structure 125 in a harsh, radiation environment, it is useful to determine the environments state, and to couple programming of e-fuse structures 125 if the environment is deemed acceptable. Thus, the method comprises generating a first signal from an e-fuse radiation detector 145 within or proximate to an e-fuse bay when radiation levels are below a pre-determined amount. The method ascertains a level of radiation that causes a false output report by the e-fuse radiation detector 145.

In addition, the method comprises programming and sensing e-fuse structures 125 in the circuit, and controlling programming access to the e-fuse structures 125. As described above, both a valid IPCODE and "ok to program" signal would be required to initiate an e-fuse program. Unsuccessful code entries are recorded into the security system 160 within e-fuse tamper bits 165 of the circuit, and the e-fuse tamper bits 165 are read and/or interrogated. Subsequently, an output of the e-fuse structures 125 is stored in a RAD-hard latch 130 in the circuit. As described above, the RAD-hard latch 130 could comprise a design using resistor coupling between inversion stages, or containing ballast capacitance to increase the storage Q-crit. The sense latch can also be designed to be RAD-hard using these same techniques.

Figure 4:
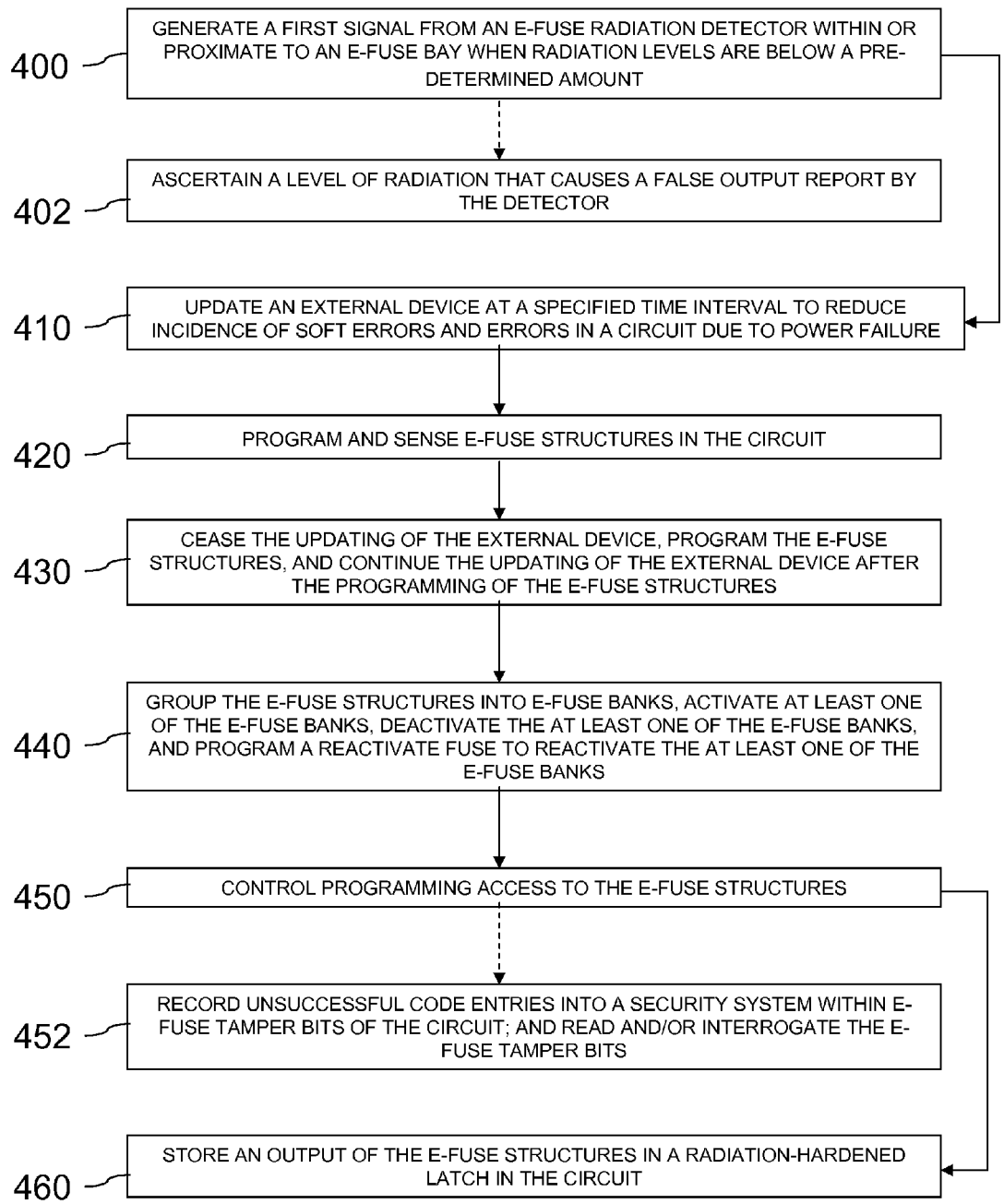
FIG. 4 is a flow diagram illustrating a method for a NVM-rh system.

FIG. 4 illustrates a flow diagram of a method for a NVM-rh system. In item 400, the method generates a first signal from an e-fuse radiation detector 145 that is within or proximate to an e-fuse bay when radiation levels are below a pre-determined amount. This involves, in item 410, ascertaining a level of radiation that causes a false output report by the e-fuse radiation detector 145. As described above, the e-fuse radiation detector 145 would have known unspecific data (a known good digital DNA preprogrammed), and a set of fuse sense and latch circuitry that is either identical in design to the circuitry that will be used to sense and latch the e-fuse structure 125, or it could be designed such that the critical charge to upset such circuitry is more sensitive to a radiation disturbance, simply by decreasing it's node capacitance. In this case all known good e-fuse bits are added to provide an "ok to program" signal. This can be coupled to each e-fuse program if desired, or the first and last e-fuse program bit.

Next, in item 420, an external device is updated at a specified time interval to reduce the incidence of soft errors and errors in a circuit due to power failure. As described above, by setting a sensing loop based on time instead of error count, the susceptibility to multi-error events reduces drastically. The method programs and senses e-fuse structures 125 in the circuit in item 430. As described above, the e-fuse structures 125 may also be fabricated of "n" bits in parallel to form one valid OR' ed bit after programming. Such an implementation would then circumvent a shadow latch. The method further comprises, in item 440, ceasing the updating of the external device, programming the e-fuse structures 125, and continuing the updating of the external device after the programming of the e-fuse structures 125. As described above, the loop will only be stopped if additional e-fuse structures 125 need to be blown again by sending the proper security tag (or IPCODE) to the controlling logic first. Once the new data has been programmed, the e-fuse sensing controls go back into the continuous loop.

In item 450, the e-fuse structures 125 are grouped into e-fuse banks 120, wherein at least one of the e-fuse banks 120 is activated, the at least one of the e-fuse banks 120 is deactivated, and a reactivate fuse is programmed to reactivate the at least one of the e-fuse banks 120. As described above, to update the programming, e-fuse bank 120 enable e-fuse structures 125 can be blown to select a new e-fuse bank 120 and to disable the previous e-fuse bank 120. In this system, data can continue to be updated until all e-fuse banks 120 have been used.

Furthermore, in item 460, programming access to the e-fuse structures 125 is controlled. As described above, due to the fact that the data stored in the e-fuse structures 125 is security dependent, a tag is first sent to the controller circuit 150 before it will allow new e-fuse structures 125 to be blown. This process is describing an IPCODE, which may or may not be scrambled. The IPCODE could be a security code or a specific address as in Internet protocol address. This code unlocks the programming node, or capability of the e-fuse structure 125. In item 470, unsuccessful code entries are recorded into the security system 160 within e-fuse tamper bits 165 of the circuit and the e-fuse tamper bits 165 are read and/or interrogated.

Moreover, in item 480, the method stores an output of the e-fuse structures 125 in a RAD-hard latch 130 in the circuit. As described above, the RAD-hard latch 130 could comprise a design using resistor coupling between inversion stages, or containing ballast capacitance to increase the storage Q-crit. The sense latch can also be designed to be RAD-hard using these same techniques.

Accordingly, embodiments herein provide an e-fuse bank 120 of on-chip e-fuse structures 125 that can be used as a means of permanent, non disruptive non volatile storage. These e-fuse structures 125 can be programmed (blown) prior to, during, or after a satellite is launched into space. Once the e-fuse structures 125 are blown, any errors induced by radiation into the latches containing the e-fuse data will be refreshed before the data has more errors in it than a standard ECC function can correct. By setting the sensing loop based on time instead of error count, the susceptibility to multi-error events reduces drastically.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. An IC non-volatile storage element, comprising:
   an integrated semiconductor stable reference component, wherein said component is resistant to external radiation,
   e-fuse structures in said component;
   a sensing circuit coupled to said e-fuse structures, wherein said sensing circuit is adapted to update an external device at a specified time interval to reduce incidence of soft errors and errors due to power failure;
   a controller circuit adapted to facilitate programming and sensing of said e-fuse structures;
   an error detection and correction circuit coupled to said sensing circuit;
   a security system coupled to said controller circuit, wherein said security system is configured to control programming access to said e-fuse structures; and
   a radiation-hardened latch adapted to store an output of said e-fuse structures.

2. The storage element according to claim 1, wherein said error detection and correction circuit comprises an e-fuse radiation detector one of within and proximate to an e-fuse bay, wherein said e-fuse radiation detector is adapted to generate a first signal when radiation levels are below a pre-determined amount.

3. The storage element according to claim 2, wherein said e-fuse radiation detector comprises data, and wherein said e-fuse radiation detector is adapted to ascertain a level of radiation that causes a false output report.

4. The storage element according to claim 1, wherein said security system comprises e-fuse tamper bits adapted to record unsuccessful code entries into said security system, wherein said e-fuse tamper bits are readable.

5. The storage element according to claim 1, wherein said sensing circuit is further adapted to cease updating said external device to program said e-fuse structures; and, continue updating said external device after programming said e-fuse structures.

6. The storage element according to claim 1, further comprising e-fuse banks of said e-fuse structures, wherein said controller circuit is adapted to program a reactivate fuse to reselect a previously deselected e-fuse bank.

7. An IC permanent non-volatile storage element, comprising:
   an integrated semiconductor stable reference component, wherein said component is resistant to external radiation,
   e-fuse structures in said component;
   a sensing circuit coupled to said e-fuse structures, wherein said sensing circuit is adapted to update an external device at a specified time interval to reduce incidence of soft errors and errors due to power failure;
   a controller circuit adapted to facilitate programming and sensing of said e-fuse structures;
   an error detection and correction circuit coupled to said sensing circuit, wherein said error detection and correction circuit comprises an e-fuse radiation detector one of within and proximate to an e-fuse bay, wherein said e-fuse radiation detector is adapted to generate a first signal when radiation levels are below a pre-determined amount;
   a security system coupled to said controller circuit, wherein said security system is configured to control programming access to said e-fuse structures; and
   a radiation-hardened latch adapted to store an output of said e-fuse structures.

8. The storage element according to claim 7, wherein said security system comprises e-fuse tamper bits adapted to record unsuccessful code entries into said security system, wherein said e-fuse tamper bits are capable of being interrogated.

9. The storage element according to claim 7, wherein said sensing circuit is further adapted to cease updating said external device to program said e-fuse structures; and, continue updating said external device after programming said e-fuse structures.

10. The storage element according to claim 7, further comprising e-fuse banks of said e-fuse structures, wherein said controller circuit is adapted to program a reactivate fuse to reselect a previously deselected e-fuse bank.

11. A method, comprising:
    updating an external device at a specified time interval to reduce incidence of soft errors and errors in a circuit due to power failure;
    programming and sensing e-fuse structures in said circuit;
    controlling programming access to said e-fuse structures; and
    storing an output of said e-fuse structures in a radiation-hardened latch in said circuit.

12. The method according to claim 11, further comprising generating a first signal from an e-fuse radiation detector one of within and proximate to an e-fuse bay when radiation levels are below a pre-determined amount.

13. The method according to claim 12, further comprising ascertaining a level of radiation that causes a false output report by said e-fuse radiation detector.

14. The method according to claim 11, further comprising:
    recording unsuccessful code entries into a security system within e-fuse tamper bits of said circuit; and
    at least one of reading and interrogating said e-fuse tamper bits.

15. The method according to claim 11, further comprising ceasing said updating of said external device, programming said e-fuse structures, and continuing said updating of said external device after said programming of said e-fuse structures.

16. The method according to claim 11, further comprising grouping said e-fuse structures into e-fuse banks, activating at least one of said e-fuse banks, deactivating said at least one of said e-fuse banks, and programming a reactivate fuse to reactivate said at least one of said e-fuse banks.

17. A method, comprising:
updating an external device at a specified time interval to reduce incidence of soft errors and errors in a circuit due to power failure;
generating a first signal from an e-fuse radiation detector one of within and proximate to an e-fuse bay when radiation levels are below a pre-determined amount;
programming and sensing e-fuse structures in said circuit;
controlling programming access to said e-fuse structures; and
storing an output of said e-fuse structures in a radiation-hardened latch in said circuit.

18. The method according to claim 17, further comprising:
recording unsuccessful code entries into a security system within e-fuse tamper bits of said circuit; and
at least one of reading and interrogating said e-fuse tamper bits.

19. The method according to claim 17, further comprising ceasing said updating of said external device, programming said e-fuse structures, and continuing said updating of said external device after said programming of said e-fuse structures.

20. The method according to claim 17, further comprising grouping said e-fuse structures into e-fuse banks, activating at least one of said e-fuse banks, deactivating said at least one of said e-fuse banks, and programming a reactivate fuse to reactivate said at least one of said e-fuse banks.

* * * * *